United States Patent [19]

Schumann et al.

[11] 4,142,146
[45] Feb. 27, 1979

[54] DIGITAL APPARATUS FOR WAVEFORM MEASUREMENT

[75] Inventors: Robert W. Schumann, Madison; Gary L. Wells, Middleton, both of Wis.

[73] Assignee: Nicolet Instrument Corporation, Madison, Wis.

[21] Appl. No.: 593,755

[22] Filed: Jul. 7, 1975

[51] Int. Cl.² .............................................. G01R 23/16
[52] U.S. Cl. .............................. 324/77 A; 324/121 R; 328/151
[58] Field of Search ................. 324/77 A, 77 B, 77 C, 324/77 CS; 307/235 C; 340/15.5; 328/72, 119, 121 R, 151

[56] References Cited

U.S. PATENT DOCUMENTS

| | | | |
|---|---|---|---|
| 3,456,189 | 7/1969 | Hornak | 324/121 R |
| 3,473,123 | 10/1969 | Hornak | 324/121 R |
| 3,659,086 | 4/1972 | Metcalf | 328/151 |
| 3,713,029 | 1/1973 | Kozo Uchida | 328/151 |

Primary Examiner—M. Tokar
Attorney, Agent, or Firm—Wayne A. Sivertson

[57] ABSTRACT

Digital instrumentation for waveform measurement including method and apparatus for providing irregularly spaced sampling times to prevent misleading visual patterns of coordinate points due to the presence of signal frequencies above the Nyquist frequency. The method and apparatus includes means for plotting coordinate points having abscissa positions corrected according to actual irregular sampling times, method and apparatus whereby irregularities are repeated for each signal sweep, and method and apparatus utilizing a bit reversal system to achieve the irregularly spaced sampling times.

12 Claims, 5 Drawing Figures

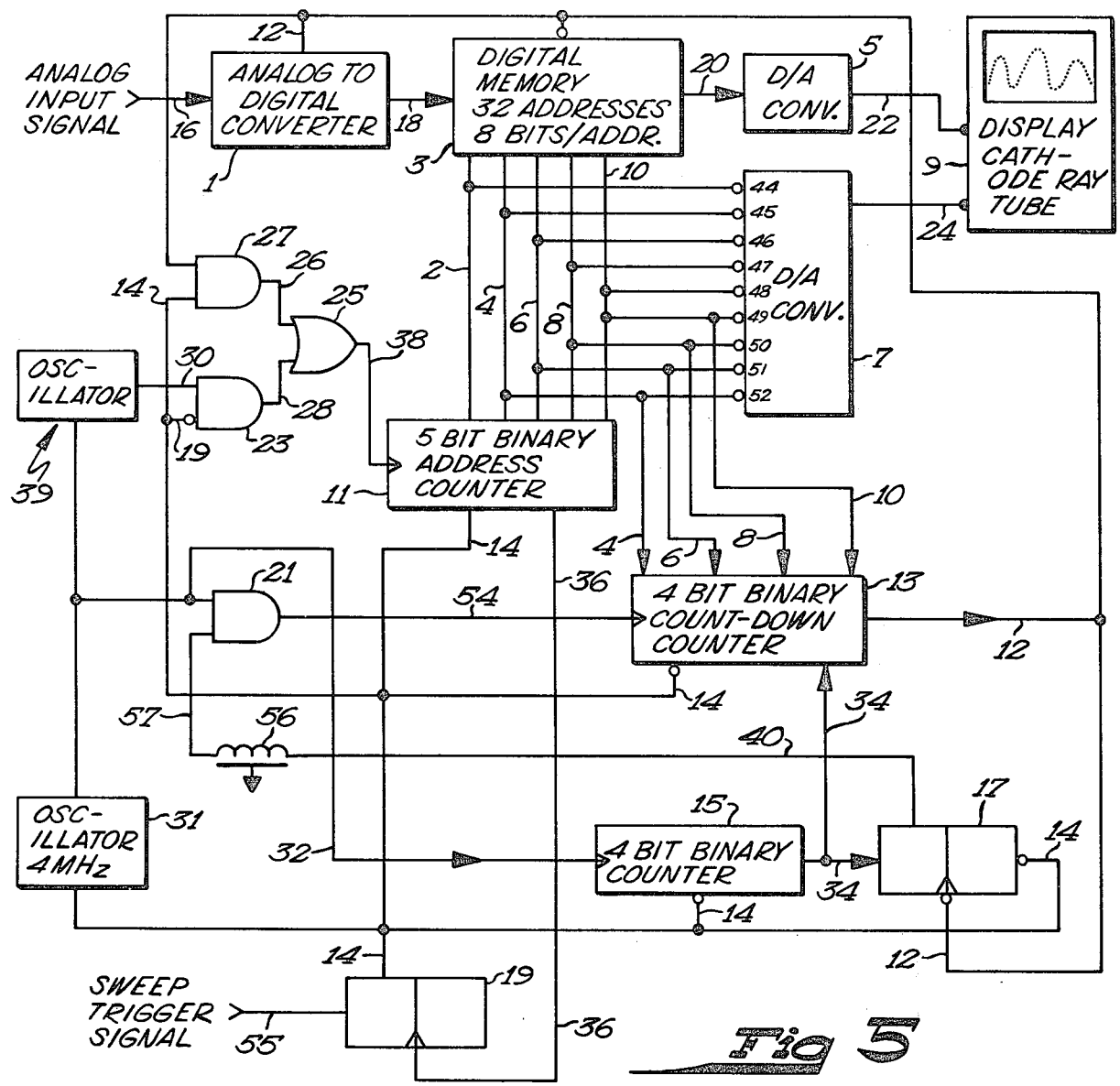
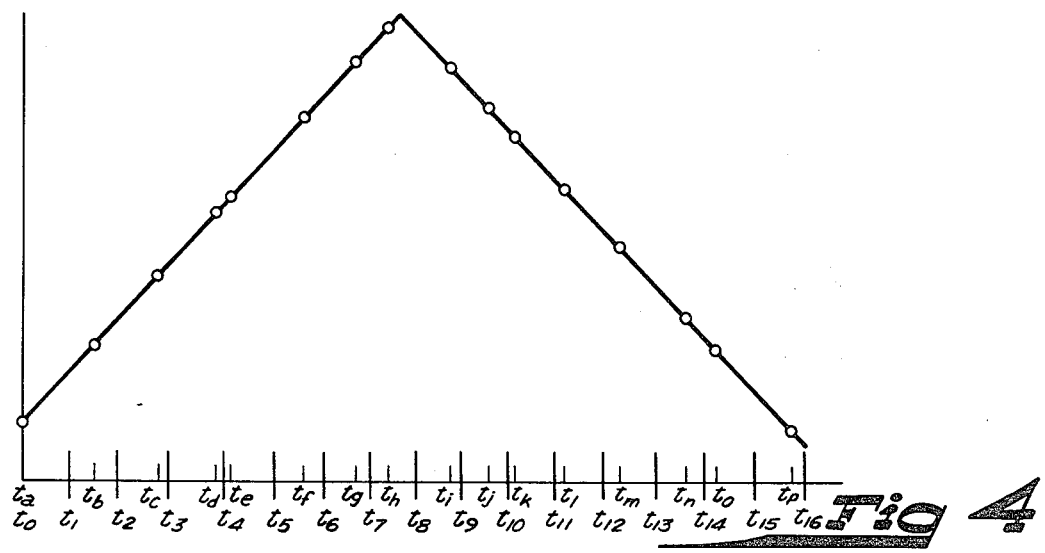

DIGITAL APPARATUS FOR WAVEFORM MEASUREMENT

BACKGROUND OF THE INVENTION

Digital instruments for measurement and display of waveforms of time-varying signals are well known in the prior art. Such instruments present the signal information as a set of coordinate points, for example on a cathode-ray tube screen (CRT). Such digital instruments generally operate by sampling each signal a multiplicity of times, measuring and recording the samples, and simultaneously or later displaying the sampled voltage values as coordinate points, each of which has an ordinate value proportional to the measured voltage, and an abscissa value equal to the sample number corresponding to that voltage. Because the samples are taken at regular time intervals relative to the sweep trigger(s), or "start of the waveform", the sample numbers, and abscissa values, are linearly related to the times at which the samples were taken.

One of the disadvantages of such prior art instruments is that if the signals being sampled and viewed are periodic, problems can arise due to an effect known as aliasing. Aliasing occurs if the signal frequency is greater than half the frequency of sampling (which is called the Nyquist frequency, $f_N$), in which case the displayed pattern of coordinate points can be exceedingly misleading to the viewer. Though each point may be shown at exactly the correct voltage and time position, the overall effect can be deceptive. For example, in case of a sine wave signal having a frequency slightly greater than $2f_N$, it is possible to get a display of sampling points indicating the presence of a sinusoid, but which appears to the operator to be at a much lower frequency. The same situation could occur with a different waveform, such as a triangular wave, in which case the aliasing pattern could also be a triangular wave at a lower frequency, all of which adds to the deceptive effect of aliasing due to signals greater than the Nyquist frequency.

Therefore, even though all high frequencies do not produce believable patterns to the viewing operator, such a large number of frequencies do cause this aliasing effect that unless the operator has some form of dependable advance knowledge that the signal frequency is below the critical frequency, he will either believe the deceptive aliased pattern, or at best be concerned that he is being mislead.

Various measures can be taken to confirm that the signal waveform is not an alias. One such measure is to reject, by filtering, all frequencies above $f_N$. This solution is impractical in digital oscilloscopes which usually provide for many different sampling rates, and therefore would require that the filter must have many selectable cut-off frequencies ranging, for example, from a small fraction of one hertz to many megahertz. Filtering, even if practical, would have the disadvantage of not allowing the operator to be aware of the existence of higher frequency signals. Another measure for testing for aliasing is to use a very high sampling rate, using one filter to reject signals having frequencies beyond the corresponding critical frequency. However, such tests are a considerable nuisance to the operator, and do not work in the situation in which a signal only occurs once. Also, in the common situation in which the signal is an amplitude modulated carrier, neither testing nor filtering is possible. Sampling frequencies must necessarily be low enough to view the modulation pattern, which may, for example, be a one kilohertz sine wave. In that case, if the oscilloscope has the ability to display only one thousand points, the sampling frequency cannot be greater than one megahertz, or less than one cycle of the modulation will be seen. Yet, the carrier may have a frequency of several megahertz, and will be subject to aliasing. In that situation, the coordinate display often is completely useless and may often show no modulation envelope at all.

BRIEF DESCRIPTION OF THE INVENTION

The apparatus and method of this invention overcome the aliasing problems of the prior art instrumentation by providing method and apparatus for sampling the signal waveform at irregular intervals. For reasons described below, this will cause no misleading patterns in virtually all cases in which the signal frequency is above the Nyquist frequency, and will still produce undistorted patterns for the cases in which that critical frequency is not exceeded. The apparatus and method of this invention also provides for coordinate points with abscissa positions corrected according to actual irregular sampling times to overcome plotting errors, for repeating the same irregular time samples for each sweep, and in the preferred embodiment accomplishes the irregular timing through bit reversal with a binary counter.

IN THE DRAWINGS

FIG. 4 is a graphic display of the same triangular pattern and sampling times of FIG. 3, but with abscissas adjusted according to actual sampling times, resulting in an unscattered set of coordinate sampling points; and FIG. 5 is a schematic block diagram of the improved digital waveform measurement apparatus of this invention.

DESCRIPTION OF THE PREFERRED EMBODIMENT

To best understand the method and apparatus of this invention it should first be recognized that the basic principle involved is that if, instead of sampling the signals at regular intervals, a sampling is done irregularly or randomly, measurements of periodic signals having frequencies above the Nyquist frequency will not result in replicas of the real signal, but instead will result in an irregular or random scattering of coordinate points which are easily recognized by the operator as evidence of high frequencies in the signal being measured.

Figure 1:
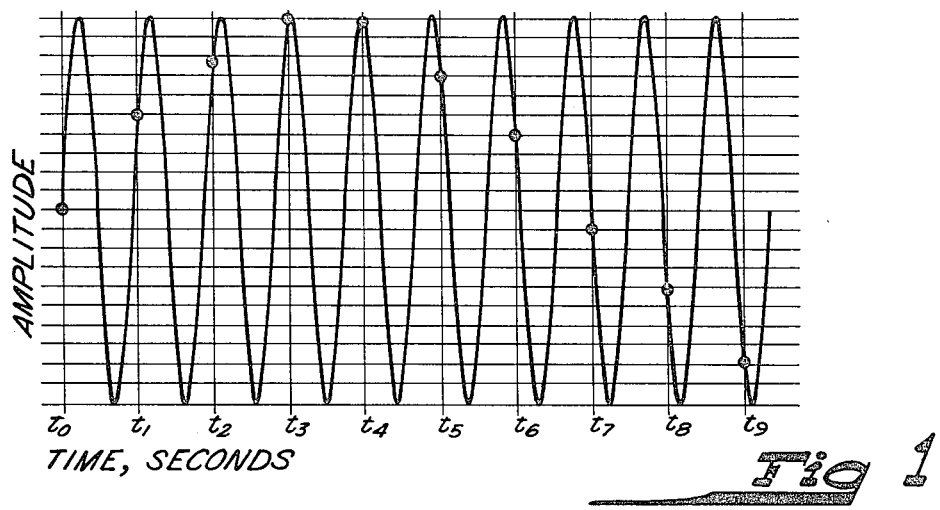
FIG. 1 is a graphic display of an actual signal and the resulting aliasing pattern, as would result from use of prior art devices.

To understand this effect note that in FIG. 1 there is illustrated a situation involving the case of a sine wave signal having a frequency slightly greater than twice the Nyquist frequency. At sampling times indicated as $t_0$, $t_1$, $t_2$, ..., $t_{10}$, the voltages which exist are indicated by the circles on the solid line sine wave. It is apparent that the locus of the circled points is in itself a sinusoid. A coordinate point display produced by a digital oscilloscope does not show the solid line pattern of FIG. 1, but only the discrete circled points. Therefore, because of this aliasing effect the operator may believe that the signal actually had an entirely different frequency than it really had.

Figure 2:
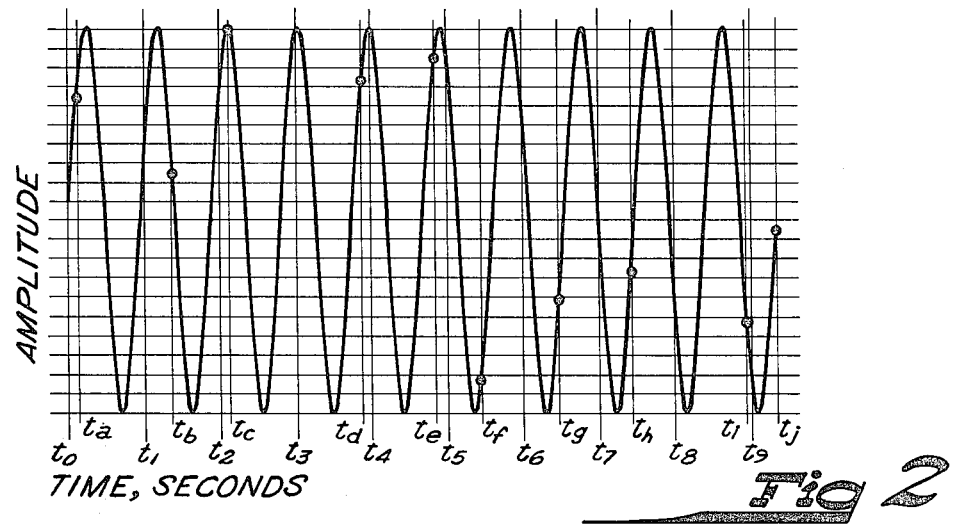
FIG. 2 is a graphic display of the same signal of FIG. 1 with a random scattering of coordinate points achieved through the apparatus and method of this invention.

Referring now to FIG. 2, the effect of the irregular or random sampling of the apparatus of this invention is shown. The solid lines show the same sine wave as that of FIG. 1, which is the signal being sampled. However, the circled points showing the voltages existing at the new sampling times $t_a, t_b, t_c, \ldots, t_k$, do not form a replica of the sine wave. The locus of these points are not suggestive of any real signal except random noise. Though FIG. 2 shows only a few coordinate points, a digital oscilloscope usually produces a thousand or more coordinate points and the scattering effect is more pronounced. The viewing operator easily learns to recognize this scattered pattern as evidence of the existence of signals having high frequencies, and he can then switch to a faster sampling rate to achieve measurement of the signal. This switching to higher sweep speeds in the common case of analog oscilloscope operation, for example, when the display appears as a solid band in analog oscilloscopes, it is an indication of the presence of high frequencies and the operator simply increases the sweep speed.

It should be noted that should regular sampling be preferred, for example, when the signal information is to be operated upon by a digital computer, the irregular sampling of this invention may be discontinued. However, in such cases the irregular sampling may first be used to inspect the signal to confirm that aliasing is not involved.

In the common situation of an amplitude modulated carrying signal to be measured, irregular or random sampling produces the desired scattering effect, but all points lie within the modulation envelope. The envelope is therefore visible and the modulation can be observed. If the modulation frequency is not greatly different from the carrier frequency, the operator may view the carrier using a sampling frequency which is sufficiently high to provide viewing of the individual cycles of the carrier, without the scattering effects.

Figure 3:
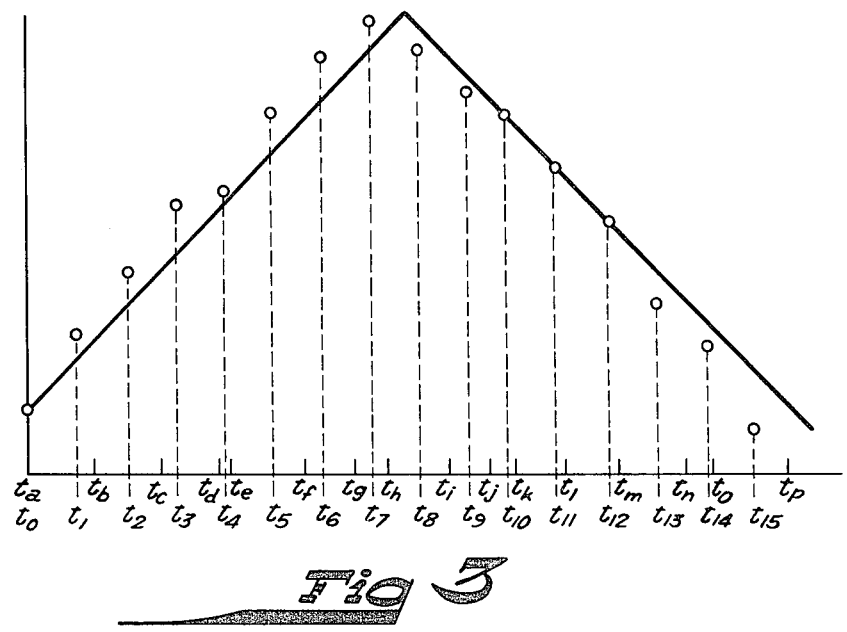
FIG. 3 is a graphic display of a triangular waveform signal with samples taken at irregular intervals and displayed at regular intervals, resulting in scattered coordinate points.

In the preferred embodiment of this invention, to avoid a scattering effect of sampled coordinate points of frequencies below the Nyquist frequency, the abscissas of the coordinate points are placed according to the actual sampling times for each point, as opposed to prior art instrumentation in which the points are plotted at regular intervals. If this correction of the abscissa values is not done, the waveform displays will be noticably scattered even at less than the Nyquist frequency, especially for frequencies near that critical frequency, as shown in FIG. 3. In FIG. 3 the same solid line triangular waveform as that of FIG. 4 is shown. It is apparent that when the abscissa values are not corrected the locus of the circled coordinate points is such as to appear to be a scattered plot, which could mislead the operator into believing the Nyquist frequency is being exceeded.

Referring now to FIG. 4, it can be seen that if the solid line triangular signal has a frequency below the Nyquist frequency, it is only necessary to adjust the abscissa values so that their positions correspond to the actual irregular sampling times used, rather than being regularly spaced, to achieve an accurate waveform representation. In FIG. 4 the locus of the displayed circular points is indeed the waveform itself.

It is the precision with which voltages are measured and timing controlled, that determines the overall resolution of the measured information. However, that resolution is lost if the points are incorrectly displayed. It would be valuable to utilize the principles of this invention to detect aliasing and to switch to regular timing after it is determined that no aliasing is occurring, and in that case it would not be necessary to correct the waveform abscissa values. Uniform abscissa spacing would then be quite acceptable. However, in the preferred embodiment of this invention, the abscissa values used for display are corrected to correspond accurately to the sampling times, and no test is needed in advance. Again, the result is that as illustrated in FIG. 4.

One simple way to handle the need to plot data points according to actual irregular sampling times would be to record both the voltage and time for each sampling in memory, and to control the CRT beam according to the recorded values. Though this approach would be simple in principle it would be expensive in terms of memory cost. Another satisfactory approach would be to predetermine the pattern of irregularity, and standardize it. The display could then be operated accordingly with the abscissa values positioned according to the "standard" sampling times. This is not a significant improvement from the standpoint of cost because the standard sampling times would need to be recorded in another memory, such as a read-only memory containing a listing of the required sequence of irregularly spaced sampling times.

It has been found that a less expensive way of handling the problem of correction of abscissa values exists. No storage of standardized delay time is required if an irregular number can be derived directly from the address number, according to a rule. One such irregular sequence can be generated by counting samples following the start of each signal to be measured, using a binary counter. If the bit order of the counted binary number is reversed, the sequence of new numbers has sufficient irregularity so that, if delays proportional to their values are used no recognizable aliasing pattern will result except in the most extraordinary circumstances. It is well known that binary counters already exist in digital oscilloscopes, because the digital memory is generally addressed according to sample number, therefore the address counter of existing digital oscilloscopes can be used to achieve the desired result.

To correct the abscissa values for display purposes, it has been determined that the number of the address from which a particular voltage value is being read also corresponds to the sample number. By reversing the order of the bits, the amount of delay that had been used in sampling that voltage is thereby known, and the abscissa of the point being displayed may be adjusted accordingly.

It should be recognized that the optimum delay sequence is probably one which is random, and there may be others essentially as effective. The numbers produced by bit reversal of the address number is not optimally effective against all signals. It is however, highly effective against periodic signals with the probability of aliasing occurring being so low as to be negligible in real situations. Because of this low probability of aliasing and the simplicity of the circuitry required to produce the delays, the preferred embodiment of the apparatus of this invention utilizes the bit reversal method. It will be recognized that other delay sequences can readily be devised, for circumstances in which greater irregularity or randomness is needed.

It should also be recognized that the delay sequence generated by the bit reversal method will be the same for each signal measured. If different delay sequences are used for each signal, then there would be even less chance of the operator being deceived if he is observing recurrent signals. However, the chance of deception is so low in the case of a repeated delay sequence, that it is practical to use the same irregular sequence repeatedly. This has the inherent advantage of not requiring that both voltages and sampling times be recorded in memory, in order that later displays can be plotted with coordinates having corrected abcissa values.

In utilizing the apparatus and method of this invention there is also the consideration as to how many choices of delay times should be used. A truly random display provides for an infinite variety of delays. The delay following a particular regular (prior art) sampling time $t_i$ would then have some value between zero and $t_{i+1} - t_i$ so as to cause the sampling to occur at some time between one regular sampling time and the next regular sampling time. The generation of random delays is difficult, and as previously pointed out, discrete delays are preferable. The question still remains as to how many discrete delay times should be provided. It may be inferred, in the preferred embodiment using address number bit reversal, that if the memory has M addresses, M discrete display values can be generated with a different delay for each of the M samples. However, it is not easy to digitally control delays at extreme speeds, and for high sampling frequencies the time $t_{i+1} - t_i$ may be very short, for example 100 nanoseconds. Then, if the number of memory addresses is even moderately large, for example 4096, the timing must be accurate to a few picoseconds. For example, the delay might be 34.024 nanoseconds in one case, and 34.049 nanoseconds in another. Such finely controlled delays would be difficult to generate. This invention uses the fact that the shorter the average interval between samples, the fewer the number of choices that need be provided. If the intervals are long, for example one second, it is a simple matter to provide delays which have a great variety, and it is only in the cases in which delays are long that a great variety is needed.

This situation exists because aliasing will not occur unless the signals being measured have a frequency above a new critical frequency which is equal to $Nf_N$, where N is the number of discrete delay value choices employed. In an actual instrument, the signals may be filtered in such a way as to reject frequencies above $\frac{1}{2} f_{max}$ where $f_{max}$ is the maximum available average sampling rate. The reason that such filtering is ordinarily acceptable is that a digital oscilloscope cannot be used for display of signals of higher frequencies than that. At $\frac{1}{2} f_{max}$, a signal would be represented by only two coordinate points.

In the preferred embodiment of the apparatus and method of this invention, eight possible delay values are used, for purposes of illustration. This protects against the occurrence of deceptive coordinate plots for all frequencies above $4f_{max}$, and makes it an easy matter to filter. The filter cut-off frequency may be set at $f_{max}$, which will have little effect on signals of interest and yet will be very effective against frequencies not protected against by the irregular sampling employed, that is, those frequencies above $4f_{max}$.

It is therefore recognized that it is not intended that the preferred embodiment be optimum in performance from a theoretical point of view. Many elaborate means can be devised to produce delays in a more random style. The preferred embodiment is a practical real device, and is more effective than simple theory would suggest for the reason that natural irregularities in timing always exist, and these typically are sufficient to prevent the deceptive patterns at frequencies which are beyond about $4f_{max}$. The effects of these natural irregularities do not affect the quality of the displays for signals of interest to the observer, which in practice are usually well below $\frac{1}{2} f_{max}$, because the natural irregularities are not large.

Referring now to FIG. 5, the operation of the apparatus of this invention will be described. In the following description, the term "positive voltage transition" means a change in voltage from nominally zero to a positive value, and "negative voltage transition" is the reverse.

In FIG. 5, there is shown an analog-to-digital converter 1 which is a conventional 8 bit ADC that includes a sample-and-hold circuit. A positive transition at a line 12 input to ADC 1 causes an input signal on line 16 to be sampled and measured. Approximately 200 nanoseconds later, the 8 bit number representing the measured voltage magnitude appears on 8 conductor cable 18. Such converters as ADC 1 are well known to those familiar with the art. There is also shown a digital memory 3 of a design well known to those of ordinary skill in the art. Memory 3 has 32 storage locations of 8 bits each. Memory 3 is addressed by a 5 bit address binary number appearing on lines 2, 4, 6, 8 and 10. A negative transition at write terminal, conductor 12, causes alterations of the contents of whichever storage location of memory 3 is being addressed. At such time, these contents become the same as the magnitude applied via 8 conductor cable 18. At all times, except for negligible settling times after address changing or alteration of data, the contents of whichever storage location of memory 3 is being addressed appears on output conductors represented by eight conductor cable 20 to be presented to a digital-to-analog converter 5, which is a well known converter that produces an analog output on cable 22 that is proportional in voltage to the magnitude of the applied 8 bit number from memory 3.

Digital-to-analog converter 7 is a well known nine bit converter which produces an output voltage on cable 24 that is proportional to the binary number presented at its input terminals 44–52. The most significant bit of the number appears at terminal 44, and the least significant bit at terminal 52, with significance decreasing from terminals 44 through 52. Line 2 is connected to terminal 44, line 4 to terminals 45 and 52, line 6 to terminals 46 and 51, line 8 to terminals 47 and 50, and line 10 to terminals 48 and 49.

Address counter 11 is a binary counter of 5 bits having an output which is a binary number appearing at conductors 2, 4, 6, 8 and 10, conductor 2 being the most significant bit and conductor 10 the least significant bit. Address counter 11 has another output on conductor 36, which is a short pulse, nominally 500 nanoseconds long, which appears at the time the counter changes from state 31 to state 0. Counter 11 has a step input on line 38, and a reset input on line 14. A negative voltage transition on line 38 causes the counter to advance one step. A positive transition of voltage at conductor 14 causes counter 11 to be cleared to state 0. When counter 11 is advancing in response to stepping pulses at line 38, its state advances to state 31, with the next step pulse causing it to overflow to state 0, in turn causing a 500 nanosecond positive pulse output to appear on conductor 36.

Counter 13 is a 4 bit binary count-down counter of a design generally known to those of ordinary skill in the art. In response to positive voltage transitions as stepping pulses at its input on a conductor 54, counter 13 steps backward in state. When counter 13 reaches state 0, it produces a positive voltage at its output on a conductor 12, which output remains positive until the next pulse causes counter 13 to step to state 15. When a control pulse appears on conductor 34 as a positive voltage, the state of counter 13 becomes the same as the magnitude of the binary number applied via conductors 4, 6, 8 and 10. Conductor 4 corresponds to the least significant bit, and conductor 10 the most significant bit. Note that this order is the reverse in significance, of that of the output bits of address counter 11. Counter 13 is reset to state 15 when a reset control voltage applied on wire 14 is near 0 voltage.

Counter 15 is another common binary counter of 4 bits which includes a one-shot multivibrator that produces a positive output pulse of nominally 100 nanoseconds whenever the state of binary counter 15 changes from state 15 to state 0. Counter 15 is stepped forward in state by positive voltage transitions received on conductor 32 except during the reset condition due to a 0 voltage on line 14.

Delay line 56 has a delay of nominally 200 nanoseconds. Delay line 56 delays the signal appearing on conductor 40 by 200 nanoseconds, and the output of delay line 56 is connected by a conductor 57 to a positive AND gate 21. Positive AND gate 21 has conductor 32 as its other input, and conductor 54 as its output.

There is also shown a positive AND gate 27, with conductors 14 and 12 as inputs and conductor 26 as its output. Another gate 23 produces a positive output on conductor 28 only when the input voltage on conductor 30 is positive and the voltage on conductor 14 is negative. Gate 25 is a positive OR gate, with conductors 26 and 28 as inputs and conductor 38 as its output. A flip-flop 19 is a latch which switches to the "on" state to make conductor 14 positive, in response to a positive voltage applied on sweep trigger signal conductor 55. Flip-flop 19 switches to the "off" state in response to a positive voltage transition on conductor 36 applied from counter 11. Flip-flop 17 is a D-type latch which is switched to the "on" state to make wire 40 positive, when there is a positive voltage on conductor 34. Flip-flop 17 is switched to the "off" state by a negative voltage transition on conductor 12, which is an output from counter 13. Flip-flop 17 is also switched to the "off" state during the existence of a negative voltage on conductor 14, which is an output of flip-flop 19.

An oscillator 29 is nominally a 40 kilohertz oscillator which supplies pulses to gate 23, via conductor 30. Oscillator 31 produces output pulses having a recurrence rate of 4 megahertz. Oscillator 31 is internally gated so that the first of these pulses occurs within a few nanoseconds of the time the voltage applied on conductor 14 becomes positive. A display unit 9 includes a cathode-ray-tube and deflection amplifiers, such as any of a convenient type which produces XY displays in response to voltages applied at conductors 22 and 24.

The apparatus described in FIG. 5 has two general operating states. In a first mode of operation, the contents of memory 3 are read out in sequence, nondestructively, for the purpose of repeatedly producing a coordinate display, in a general manner well known in prior art apparatus. This method of operation will be explained below. In a second mode of operation the apparatus of FIG. 5 will measure an input signal on line 16 at a number of sampling times, record the measurement results in memory 3, and concurrently display the information being stored. After 32 such measurements have been made and recorded, the second mode ends, and operation reverts back to the first mode of repeated display of information only. The two modes of operation will be referred to as the display mode and the sweep mode.

The start of the sweep mode is caused by an externally generated sweep trigger signal appearing at conductor 55. The sweep mode ends automatically following the recording of the 32nd signal voltage value. It will be recognized from the following description that the only essential difference between the operation of the apparatus of FIG. 5 and that of prior art devices of a similar nature is that the timing of the voltage measuring process is irregular or random, rather than being uniform; and the placement of coordinate points in the coordinate display is such that the abscissa values for the points are irregular in a manner to correspond to the timing irregularities.

The operation of the apparatus of FIG. 5 will now be described, assuming a start at the time of occurrence of a sweep trigger pulse on conductor 55. Prior to that time, the signal on conductor 14 will have been negative due to the action of the end-of-sweep signal (to be described below) at some prior time, which caused the reset of flip-flop 19. The signal on conductor 14 will be referred to as the sweep signal. Because of the action of the reset signal from flip-flop 19 on conductor 14, counter 13 will be at state 15 and counter 15 at state 0 at the moment the sweep trigger pulse occurs and causes flip-flop 19 to switch to the "on" state. The transition of the sweep signal from 0 to positive also resets address counter 11.

At a short time later, within 250 nanoseconds, a positive pulse from oscillator 31 will be applied to counter 15 through conductor 32, with the positive transition causing a step in counter 15. This stepping action will continue throughout the sweep mode. Therefore, because counter 15 is a 4 bit binary counter, at 4 microsecond intervals beginning 4 microseconds after the time of the trigger signal, positive pulses will appear at conductor 34 which is the output of counter 15. These will be referred to as the regular timing pulses.

When a regular timing pulse occurs, flip-flop 17 is set, and a positive voltage appears on conductor 40. The output of counter 15 on conductor 34, transmitted to counter 13 through 34, also causes the state of counter 13 to be set at the state represented by the voltages on conductors 4, 6, 8 and 10. The state of these conductors corresponds to the state of address counter 11's four least significant bit states. Because address counter 11 is at that time at state 0, the number loaded into counter 13 will be 0, and as indicated earlier the output signal on conductor 12 at that moment becomes positive, because it is positive when and only when counter 13 is in state 0. Thus, with no significant delay, conductor 12 becomes positive at the same time as the occurrence of the first of the regularly timed pulses.

The positive transition of voltage on conductor 12 causes converter 1 to sample and to begin measurement of the input voltage at conductor 16. Nominally 200 nanoseconds later the nearly simultaneous occurrence of a write command and an address change command are allowable. The information is thus entered into address 0 of memory 3.

The switching of flip-flop 17 to the "off" state by the negative transition on line 12 causes conductor 40 to become negative, and conductor 57 also to become negative 200 nanoseconds later. The following pulse from oscillator 31 will therefore be blocked by gate 21, so that counter 13 remains in state 15 for several microseconds. The same pulse from oscillator 31, which will have occurred at time t=4.25 microseconds, will have advanced counter 15 by one state. At time t=8.0 microseconds counter 15 will have once again changed from state 15 to state 0, and the resulting voltage transition on conductor 34 will cause a new binary number to be loaded into counter 13.

The new number in counter 13 will be binary number 1000, because conductor 10 is now a "1", and conductors 8, 6 and 4 are "0s". As described above, when flip-flop 17 is in the "on" state, counter 13 will step backwards with each output pulse from oscillator 31, and after 8 of these pulses counter 13 will reach state 0. Thus, because this process of counting down began at time t=8.25 microseconds, state 0 will be reached at time t=10.00 microseconds. Counter 13 reaching state 0 again causes the signal to be sampled and measured, as described above.

It will be apparent that this process will continue, with a different binary number loaded into counter 13 each cycle, until all possible 4 bit numbers have occurred. After that, the same sequence of binary numbers will repeat. The numbers loaded into counter 13 will be the well known 4 bit numbers representing the binary numbers 0-15. Each of these loaded binary numbers will result in different lengths of time for counter 13 to count down to 0, following each of the regular timing pulses from counter 15. The respective number of steps to count down for binary numbers 0-15 will be: 0, 8, 4, 12, 2, 10, 6, 14, 1, 9, 5, 13, 3, 11, 7 and 15. The time intervals at which converter 1 samples the signal will therefore be irregular.

After this sequence has been repeated once, address counter 11 will have reached state 31, and the negative transition of voltage on conductor 12 that occurs 250 nanoseconds after the "final" or 32nd sample has been taken, will produce a change of address counter 11 from state 31 to state 0, which produces an output pulse on conductor 36, which in turn causes flip-flop 19 to turn off, thus ending the sweep mode of operation.

Counters 13 and 15 are set to state 15 and state 0, respectively, because the sweep signal on conductor 14 has become 0. This means that there are no further changes in the voltage on conductor 12, so there are no further memory write operations.

Since conductor 14 has become 0, gate 27 is closed, and gate 23 is open, so 40 kilohertz stepping pulses are applied to address counter 11, which thereafter steps continuously through its 32 states. This automatically addresses memory 3 sequentially, so the contents of memory 3 are sequentially applied to converter 5, the output of which produces vertical deflections of the display cathode-ray-tube beam.

For a particular address the horizontal deflection on display unit 9 is provided as a result of applying the address number bits to digital-to-analog converter 7. Converter 7 produces horizontal deflection voltages to display unit 9 according to the actual sampling times. The actual sampling time for the mth sampling is equal to 4m microseconds plus a certain delay, where m is the sample number, these being numbered 1-32. The delay, as described above, is 0.25M microseconds where M is the number produced by reversing the bit order of the 4 least significant bits of the number m, where m is expressed in binary form. Thus, for sampling voltage (ordinate) information corresponding to the mth sampling, the time (abscissa) should be positioned from the left of the screen an amount proportional to the sample number plus a small amount more, proportional to the delay involved for that sample. Assuming the screen width to be a little more than 32 units, the amount of adjustment for delay may be nearly one unit. The actual amount is M/16 units, where M is the number formed by reversing the order of the 4 least significant bits.

Using a digital-to-analog converter having binary weighting of the output, the 5 address number bits must be applied in order of their significance, followed by the bits of the number M in decreasing significance. Thus, for an address number abcde, where a is the coefficient of the most significant bit, b the next, and e the least significant bit coefficient, the actual sampling time will have been abcdeedcb. This number, applied in ordinary order of significance to binary weighted digital-to-analog converter 7 will result in an output voltage proportional to that actual sampling time. The constant of proportionality should preferably be such as to cause essentially a full screen deflection, and there should preferably be a bias added within display unit 9 such that the first coordinate point falls near the left edge of the screen.

The above-described operation of the embodiment of FIG. 5 indicates one way in which irregular delays can be produced in the sampling process of a digital device for measurement of waveforms, and a way that abscissa positioning may be accomplished accordingly. There are many other ways in which irregular timing and abscissa position can be achieved, which those skilled in the art can devise. The delays may, for example, be generated by analog rather than digital circuits. The bit reversal method, use of random numbers stored in a read-only memory which is addressed by the same address registers as used for the data storage memory, and any of many more methods may be used. It is also possible to devise manners of utilizing finer gradations in the spacing of possible delay values. For example, the apparatus of FIG. 5 may be revised to produce more delay values by increasing the number of bits used for counters 13 and 15, applying all 5 address number bits, reversed, to counter 13 instead of just 4 of them and doubling the frequency of oscillator 31 to 8 megahertz.

It should furthermore be appreciated that in some situations measurements are made of signals so short in time that there is no opportunity to measure and record more than one or a few voltage values during one signal occurrence. During successive signal occurrences, additional samples are taken and recorded. In prior art devices the times of samples have been regularly spaced with respect to each signal start time. The same principles employed in this invention as described can readily be applied to this measurement situation. An irregularity of the exact moment of sampling can be employed, and equivalent irregularities in abscissa position of coordinate points may be employed.

Because of the effects illustrated in FIG. 2, signals which are periodic and which have frequencies above the Nyquist frequency, in this case 125 kilohertz, are unlikely to produce misleading coordinate displays to aliasing, unless they are of frequencies near or above 2 megahertz. Use of filters in external signal paths, to prevent such high frequencies from being present will prevent aliasing of those higher frequency signals, without the need for an exceedingly sharp cut-off filter adjusted to block all signal frequencies near or above 125 kilohertz. Signals below the Nyquist frequency will, in this embodiment, be displayed without appreciable errors other than those due to small and unintentional timing variations. Obviously, a far greater range of allowable signal frequencies can be realized, by using finer increments of possible delay time. The times and numbers provided in the above description of the preferred embodiment are therefore intended to be for the purposes of example.

What is claimed is:

1. In waveform measurement apparatus including means for taking a time sequence of voltage samples of a signal, and means for displaying the sampled voltages to provide a representation of the signal, the improvement comprising: means for taking the voltage samples at random times for providing a scattered display to prevent aliasing when the signal includes frequency components greater than half the sampling frequency.

2. The apparatus of claim 1 including: means for displaying the randomly timed samples at times related to actual sampling time, for providing a display representative of the signal when the signal includes frequency components less than half the sampling frequency.

3. In digital apparatus for analog waveform measurement including signal input means, signal sampling means for taking a plurality of voltage samples of a signal, memory means for storing the sampled voltages, digital address counter means for controlling the memory means, and coordinate display means connected to the memory means for displaying sampled voltages, the improvement comprising: timing control means connected to the sampling means for taking the plurality of sample voltages at sequential irregularly spaced time intervals, to prevent aliasing effects.

4. The apparatus of claim 3 in which: the timing control means is connected to the address counter means for deriving the irregular time intervals from the states of the address counter means.

5. The apparatus of claim 4 in which: the timing control means includes further counter means connected to the address counter means for deriving the irregular time intervals by bit reversal of the states of the address counter means.

6. The apparatus of claim 3 including: means connected to the display means for providing abscissa values for each displayed sampled voltage related to the actual time the voltage sample was taken.

7. The apparatus of claim 5 including: means connected to the address counter means and display means for providing abcissa values for each displayed sampled voltage related to a bit reversal of the corresponding state of the address counter means.

8. In digital apparatus for analog waveform measurement including signal input means, signal sampling means for taking a plurality of voltage samples of a signal, memory means for storing the sampled voltages, address counter means for controlling the memory means, and coordinate display means connected to the memory means for displaying sampled voltages, the improvement comprising: timing control means connected to the sampling means for taking the plurality of sample voltages at irregularly spaced time intervals, to prevent aliasing effects; further counter means connected to the address counter means, means for entering at least a portion of the state of the address counter means into the further counter means in reverse order of bit significance; and means connecting the further counter means to the timing means for controlling the spaced time intervals between sample voltages according to the count time of the further counter means.

9. The apparatus of claim 8 including: means connected to the display means for summing each address counter state with the reverse order portion put into the further counter means, for providing abscissa values for each displayed sampled voltage related to the actual irregular time the sample was taken.

10. In the method of measuring waveforms with digital apparatus comprising the steps of taking a sequence of voltage samples of a signal, storing the sampled voltages, and displaying the sampled voltages on a coordinate display, the improvement comprising: controlling the storing and displaying of sampled voltages with a counter; deriving irregular time intervals from the states of the counter; taking the voltage samples at said irregular time intervals; and displaying the voltage samples at times related to the irregular times between intervals.

11. The method of claim 10 including the step of: altering the bit order of the state of the binary counter to derive the irregular time intervals.

12. The method of claim 10 including the step of: repeating the same set of irregularly spaced time intervals for each sequence of voltage samples.

* * * * *